United States Patent
Zhang et al.

(10) Patent No.: US 11,619,670 B2
(45) Date of Patent: Apr. 4, 2023

(54) SYSTEM AND METHOD FOR DETECTING WINDING FAULTS IN A GENERATOR

(71) Applicant: Caterpillar Inc., Peoria, IL (US)

(72) Inventors: Yanchai Zhang, Dunlap, IL (US); Wenming Zhao, Dunlap, IL (US); Yong Sun, Dunlap, IL (US); Xuefei Hu, Dunlap, IL (US)

(73) Assignee: Caterpillar Inc., Peoria, IL (US)

( * ) Notice: Subject to any disclaimer, the term of this patent is extended or adjusted under 35 U.S.C. 154(b) by 278 days.

(21) Appl. No.: 16/837,701

(22) Filed: Apr. 1, 2020

(65) Prior Publication Data
US 2021/0311122 A1    Oct. 7, 2021

(51) Int. Cl.
   *G01R 31/34*   (2020.01)
   *G01H 1/00*    (2006.01)

(52) U.S. Cl.
   CPC .......... *G01R 31/343* (2013.01); *G01H 1/003* (2013.01)

(58) Field of Classification Search
   CPC .... G01R 31/343; G01R 31/72; G01R 31/346; G01R 31/52; G01H 1/003; G01H 13/00; G01H 17/00
   See application file for complete search history.

(56) References Cited

U.S. PATENT DOCUMENTS

| | | | |
|---|---|---|---|
| 6,144,924 A * | 11/2000 | Dowling | G01R 31/343 702/60 |
| 6,672,175 B2 | 1/2004 | Jin et al. | |
| 8,587,250 B2 | 11/2013 | Villwock et al. | |
| 9,823,308 B2 | 11/2017 | Rodriguez | |
| 2003/0130810 A1 * | 7/2003 | Smulders | G01M 7/02 702/56 |

(Continued)

FOREIGN PATENT DOCUMENTS

| | | | | |
|---|---|---|---|---|
| CA | 2808989 A1 * | 10/2013 | ........... | B64C 27/001 |
| CN | 101710162 A | 5/2010 | | |

(Continued)

OTHER PUBLICATIONS

Cuevas Mauricio et al: "Noninvasive Detection of Winding Short-Circuit Faults in Salient Pole Synchronous Machine with Squirrel-Cage Damper", IEEE Transactions on Industry Applications, IEEE Service Center, Piscataway, NJ, US, vol. 54, No. 6, Nov. 1, 2018 (Nov. 1, 2018), pp. 5988-5997, XP011691379, ISSN; 0093-0004, DOI: 10.1109/TIA.2018.2861860 [retrieved on Oct. 10, 2018].

(Continued)

*Primary Examiner* — Manuel A Rivera Vargas
*Assistant Examiner* — Yaritza H Perez Bermudez
(74) *Attorney, Agent, or Firm* — Leydig, Voit & Mayer, LTD.

(57) ABSTRACT

A detection system for detecting winding faults, such as inter-turn winding faults in the stator and/or rotor of an electrical generator utilizes one or more vibration sensors that can be located on a generator housing. The vibration sensors make mechanical vibration measurements and transmit them to a fault analyzer. The fault analyzer can compare the measured vibrations with a threshold to determine if a winding is occurring. In an embodiment, the fault analyzer can convert the mechanical vibration measurements from the time domain to a frequency domain to facilitate analysis.

17 Claims, 7 Drawing Sheets

(56) References Cited

U.S. PATENT DOCUMENTS

| | | | | |
|---|---|---|---|---|
| 2009/0033357 | A1* | 2/2009 | Lindsey | G01R 31/346 |
| | | | | 361/21 |
| 2014/0049285 | A1* | 2/2014 | Rodriguez | G01H 1/003 |
| | | | | 324/765.01 |
| 2014/0253139 | A1* | 9/2014 | Lindsey | E01C 19/22 |
| | | | | 404/95 |
| 2018/0100895 | A1* | 4/2018 | Nadarajan | G01R 31/346 |
| 2019/0099886 | A1* | 4/2019 | Chattopadhyay | G05B 23/024 |
| 2022/0200413 | A1* | 6/2022 | Druant | B60K 1/00 |

FOREIGN PATENT DOCUMENTS

| | | |
|---|---|---|
| CN | 103823150 B | 1/2017 |
| CN | 106525337 A | 3/2017 |
| CN | 105548799 B | 1/2019 |
| KR | 10-1326586 B1 | 11/2013 |

OTHER PUBLICATIONS

Mauricio Cuevas et al. "Noninvasive Detection of Winding Short-Circuit Faults in Salient Pole Synchronous Machine With Squirrel-Cage Damper", Article, pp. 1-10, publication date: Jan. 11, 2018.
Examination Report for Int'l. Patent Appln. No. 202114010337, dated Aug. 5, 2022 (6 pgs).

\* cited by examiner

SYSTEM AND METHOD FOR DETECTING WINDING FAULTS IN A GENERATOR

TECHNICAL FIELD

This patent disclosure relates generally to a system and method for detection of electrical faults in a synchronous generator and, more particularly, to a system and method utilizing mechanical vibration measurements to identify electrical faults with the winding end turns or inter-turns in the generator.

BACKGROUND

Electrical generators are widely used to generate and provide electrical power for various applications having different power requirements, typically referred as the electrical load. Electrical generators may utilize different technologies and operating principles and can be designed to produce electrical power according to different forms, ratings and characteristics. Three-phase, alternating current, synchronous generators are a particular type used to generate large amounts of poly-phased electrical power for industrial applications or supplying electrical grids. These generators have a rotor rotatably coupled to a source of rotating motive power and which is rotatably disposed in a stator that surrounds the rotor. Both the rotor and the stator may include windings, or conductive wires, wound in successive loops around their respective structures. When the rotor, which serves as an electromagnet, is caused to rotate within the stator, the rotating magnetic field induces an alternating current in the stator windings that can be directed to the output leads of the generator. The stator windings may be grouped so that the electrical output is three-phase power and the magnetic lock between the rotor winding and the stator windings may be such that the frequency of the electrical output from the stator directly corresponds to, or synchronizes with, the rotational input speed of the rotor.

Electrical faults in generators may occur for a variety of reasons, for example, short circuits or open circuits between the conductors that unintentionally alter the electrical path through the generator. Furthermore, manufacturing and assembly errors may result in misalignment of the conductors and/or windings such that their electromagnetic interaction is adversely affected. Such electrical faults typically result in noticeable changes to the expected electrical output of the generator and can be detected by monitoring variables associated with the electrical output such as power, voltage, current, etc. Certain faults that may occur with the stator windings and/or rotor windings, however, are more difficult to detect. Winding inter-turn faults, for example, are shorts resulting from contact between adjacent conductors of the same winding as the conductors turn or loop about the structure of the stator and/or rotor. At least initially, these faults do not result in drastic changes to the operation or electrical output of the generator and are more difficult to detect. Accordingly, the present application is directed to early detection of winding faults so that corrective action can be taken to prevent long term electrical and mechanical damage to the electrical generator.

SUMMARY

The disclosure describes, in one aspect, a detection system for detecting winding inter-turn faults in a stator of a poly-phase synchronous electrical generator. The electrical generator includes a rotor rotatably disposed on a rotation axis and a stator including a plurality of stator windings fixedly disposed around the rotor. One or more vibration sensors can be located on a generator housing of the electrical generator that accommodates the stator and the rotor. The vibration sensors are able to measure mechanical vibration measurements in a time domain and to output an electrical signal indicative of the mechanical vibration measurements. The detection system also includes a fault analyzer in communication with the vibration sensors to receive the electrical signal. The fault analyzer is configured to convert the mechanical vibration measurements from the time domain to a frequency domain including a plurality of harmonics; isolate a higher order harmonic from a fundamental harmonic and further higher order harmonics; compare the higher order harmonic with a threshold value; and generate and output a fault signal indicative of a stator winding inter-turn fault if the higher order harmonic exceeds the predetermined threshold value.

In another aspect, the disclosure describes a detection system for detecting winding inter-turn faults in a rotor in a poly-phase synchronous electrical generator. The electrical generator includes a rotor having a plurality of rotor windings disposed thereon and a stator including a plurality of stator windings fixedly disposed around the rotor. A plurality of vibration sensors is located on a generator housing of the electrical generator that accommodates the stator and the rotor. The plurality of vibration sensors is able to measure mechanical vibration measurements in a plurality of directions and to output an electrical signal indicative of the mechanical vibration measurements. The detection system also includes a fault analyzer in communication with the plurality of vibration sensors to receive the electrical signals therefrom, the fault analyzer configured to partition the mechanical vibration measurements from each of the plurality of vibration sensors into a plurality of directional measurements, compare the plurality of directional measurements with a plurality of threshold values corresponding to the plurality of directional measurements; and generate and output a fault signal indicative of a rotor winding inter-turn fault if the plurality of directional measurements exceeds the corresponding plurality of threshold values.

In yet another aspect, the disclosure describes a kit for detecting winding inter-turn faults in a poly-phase synchronous electrical generator. The kit includes one or more vibrations sensors for mounting to a generator housing of the electrical generator accommodating a stator and a rotor. The vibration sensors are configured to measure mechanical vibration measurements in a time domain and to output an electrical signal indicative of the mechanical vibration measurements. The kit also includes a fault analyzer configured to receive the electrical signal; to convert the mechanical vibration measurements from the time domain to a frequency spectrum in a frequency domain; to compare the mechanical vibration measurements in the frequency domain with a threshold value; and to generate a fault signal output if mechanical vibration measurements exceeds the threshold measurements. The kit can also include a network transceiver to communicate the fault signal to a backend system.

DETAILED DESCRIPTION

Figure 1:
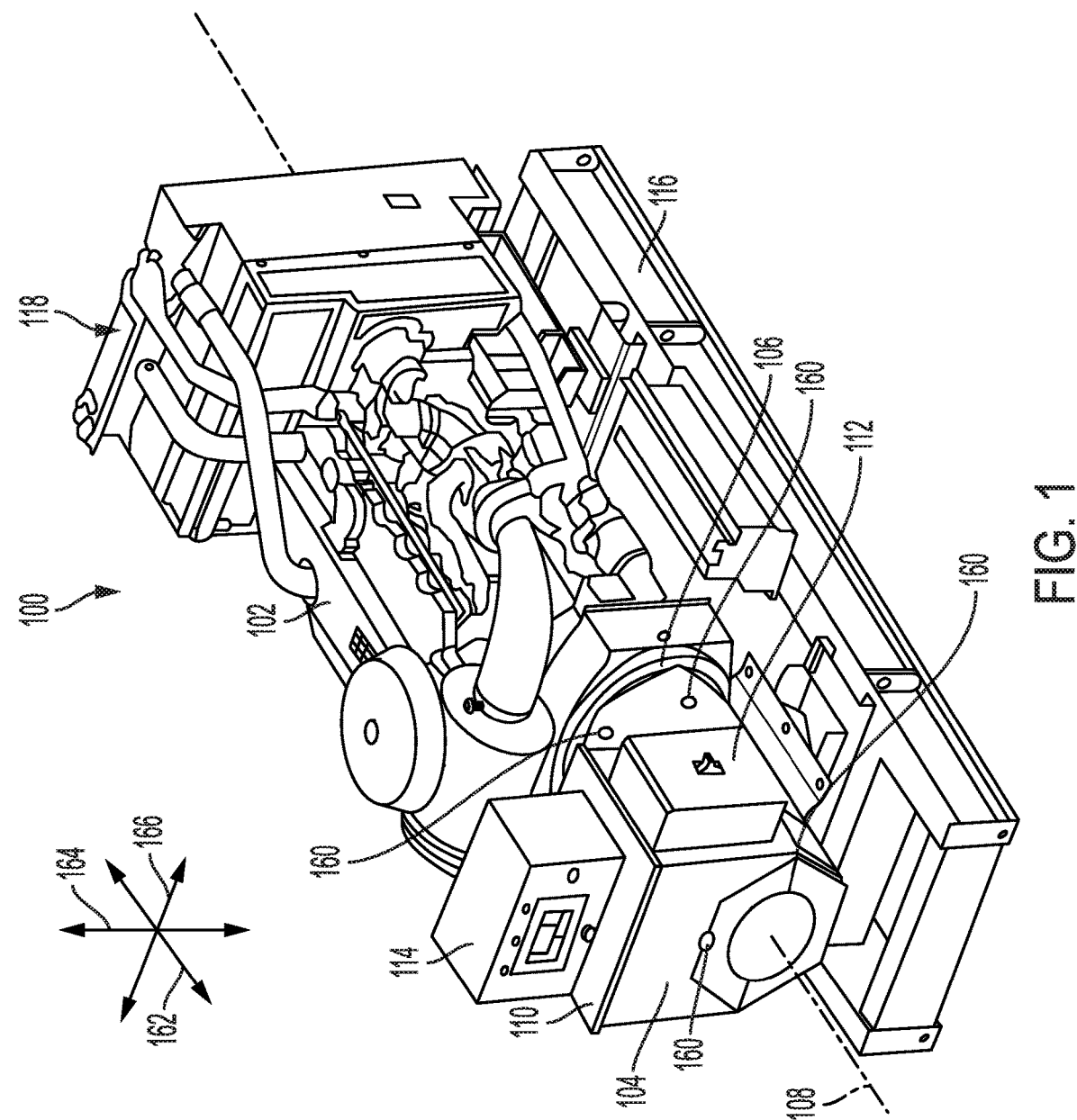
FIG. 1 is a schematic diagram of a genset including a diesel engine and an electrical generator mounted on a chassis and illustrating different reference orientations and possible locations for vibration sensors in accordance with the disclosure.

Now referring to the drawings, wherein whenever possible like reference numbers will refer to like elements, there is illustrated an engine-generator or genset 100, which is the combination of a motive power source 102 coupled to an electrical generator 104. The motive power source 102 can be any suitable power source such as, for example an internal combustion engine like a diesel-burning, compression ignition engine or a gas turbine. In such motive power sources 102, a hydrocarbon-based fuel is combusted with an oxidizer to convert the latent chemical energy therein to rotational mechanical power directed to a drive shaft 106. The motive power source 102 and drive shaft 106 may be inline with the generator 104 so that rotational motive power is transferred thereto and the components of the genset 100 are thereby aligned along a rotation axis 108 of the genset. The rotational and stationary components of the electrical generator 104 may be accommodated in a generator housing 110, which may be constructed as a sheet metal or plate metal enclosure. Mounted to the generator housing 110 can be a switch housing or terminal housing 112 which accommodate the conductive electrical output leads and switches from the electrical generator 104 that can physically connect with transmission lines extending to the electrical load. In addition to the terminal housing 112, a control cabinet or control panel 114 can be included on the electrical generator 104 to accommodate various controls, inputs, and outputs for monitoring and regulating operation of the electrical generator and the associated motive power source 102. The controls and interfaces may include buttons, keypads, dials, readouts, visual displays, and the like adapted for interaction with a human operator.

In the illustrated embodiment, the genset 100 may be rated for generating significant quantities of electrical power on the order of tens or hundreds of kilovolt-amps, and because of the related size of the motive power source 102 and the electrical generator 104, the genset can be mounted to a chassis 116. However, aspects of the disclosure may be applicable to gensets 100 of many different sizes and ratings. The chassis 116 can accommodate other subsystems and components for operation of the genset 100, such as a fuel reservoir for the motive power source 102 and a battery for exciting the electrical generator 104, and can organize and fixedly secure the various conduits and power and signaling conductors associated with the genset 100. In the illustrated embodiment, to thermally cool the motive power source 102 and/or the electrical generator 104, which may produce thermal heat during operation, the genset 100 can include a radiator 118 mounted to the chassis 116 at one axial end that can provide air and/or liquid cooling functionality.

Figure 2:
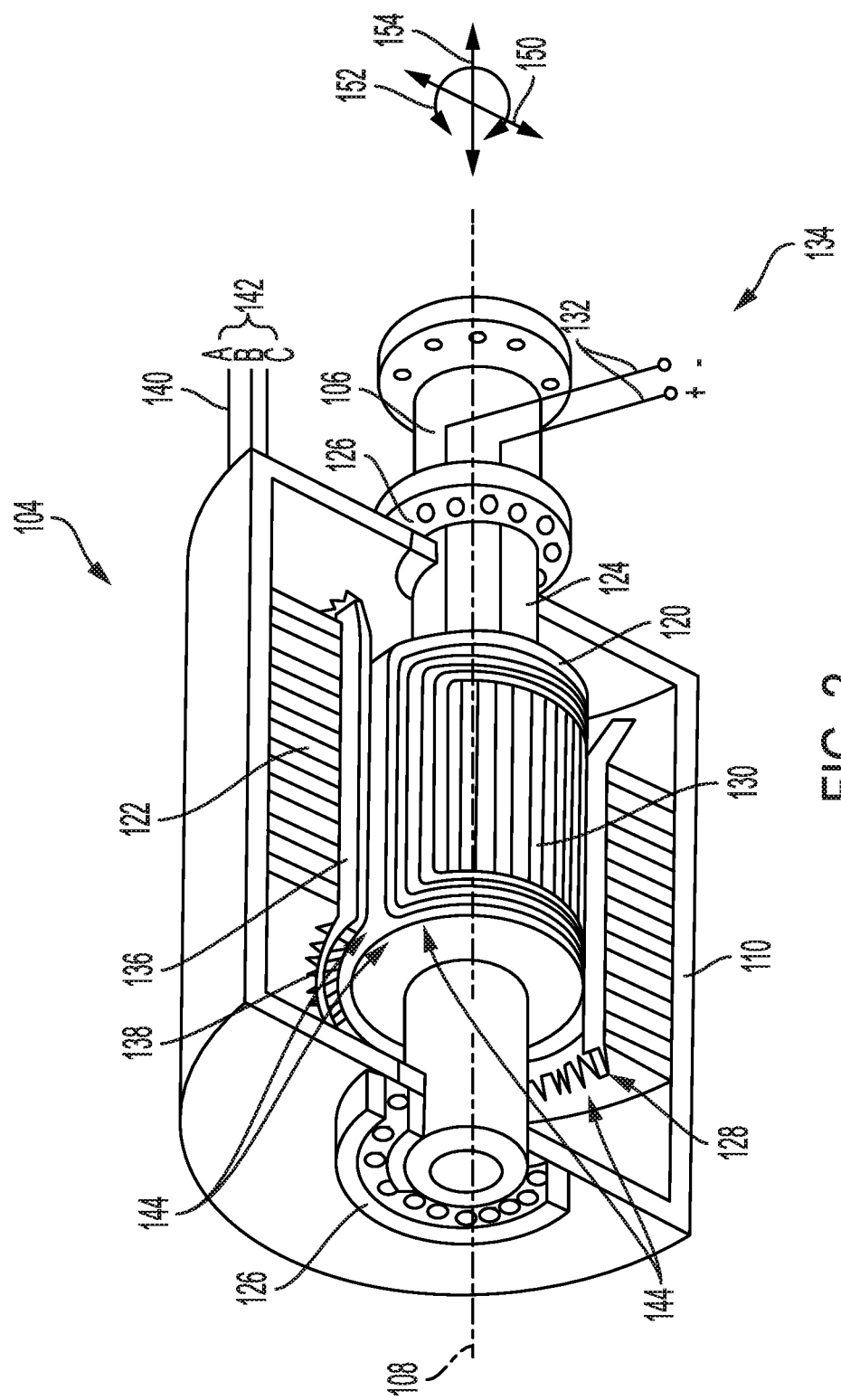
FIG. 2 is a schematic diagram of an electrical generator with a portion of the generator housing removed to show the stator and the rotor disposed therein and illustrating reference orientations of possible mechanical vibrations associated with winding faults.

Referring to FIG. 2, there is illustrated an example of an electrical generator 104 that can generate electrical power in accordance with the disclosure. In an embodiment, the electrical generator 104 can be configured as a three-phase, alternating current, synchronous generator to produce three-phase power. The electrical generator 104 can include a rotor 120 concentrically surrounded by and rotatably disposed within a stator 122 and that are aligned with the rotation axis 108 of the genset. The rotor 120 can be cylindrical in shape and can be mounted to an elongated rotor shaft 124 that extends through the generator housing 110 that accommodates the rotor 120 and stator 122. The rotor shaft 124 likewise aligns with respect to and extends along the rotation axis 108. To rotatably support the rotor 120 within the concentric stator 122, the rotor shaft 124 can be mounted to the axial ends of the generator housing 110 through bearings 126. One axially end of the rotor shaft 124 can be mechanically coupled to the drive shaft 106 from the motive power source to turn the rotor 120 within the stator 122. The stator 122 can be fixedly mounted in the generator housing 110 and can be annular in shape to define a central annular cavity sized to accommodate the rotor 120 and to provide a clearance or air gap 128 there between allowing for relative rotation of the rotor. The rotor 120 and the stator 122 can be axially coextensive in length.

In the present embodiment where the electrical generator 104 operates synchronously, the rotor 120 includes a plurality of rotor windings 130 made from lengths of conductive wires that traverse the axial length of the rotor in continuous loops. The rotor winding 130 can include rotor leads 132 that may extend from the rotor 120 through the generator housing 110 and can electrically connect with a small external power source 134, sometimes referred to as exciter, such as a DC power supply or battery. Electrical contact between the rotor windings 130 on the rotor 120 and the rotor leads 132 to the external power source 134 can occur through brushes and/or commuters. The rotor 120 may be made of a ferroelectric material such as iron or steel such that when a current is directed from the external power source 134 through the rotor windings 130, the rotor generates an electromagnetic field circumferentially around the rotor that crosses the air gap 128 and passes into the stator 122. Rotation of the rotor shaft 124 via the motive power source causes the excited magnetic field to pass circumferentially within the stator 122 in a rotational direction. In various embodiments, the rotor windings 130 can be arranged in groups so that the rotor 120 can be configured in different arrangements of opposing magnetic poles (i.e. north and south) such as a two-pole arrangement, a four-pole arrangement, etc.

To electromagnetically interact with the rotating magnetic field, the stator 122 can include stator windings 136 that can be in the form of a plurality of conductive wires located in a plurality of axially arranged grooves or stator slots 138 radially disposed into the inner circumferential surface of the stator structure. Like the rotor windings 130, the stator windings 136 can axially traverse back and forth along the axial length of the stator 122 and can loop or pass between adjacent stator slots 138. As the rotating magnetic field from the rotor windings 130 passes, for example, in the counter-clockwise direction, across the axially arranged stator windings 136, electromagnetic induction induces an electromotive force (EMF) or voltage in the conductive stator windings. To transmit the current resulting from the induced voltage, the stator windings 136 may also be operatively associated with stator leads 140 extending from the generator housing 110 and that can electrically connect with the load 142. In an embodiment, the stator windings 136 can be arranged in groups so that the induced voltage and current is separated into distinct electrical phases such as, for example, a three-phase arrangement.

During normal operation, the electromagnetic interaction between the concentrically aligned rotor 120 and stator 122 may be symmetrically balanced and the bearings 126 may fixedly support the rotor shaft 124 with respect to the generator housing 110 such that relative rotation between the rotor and stator is concentric. During such normal operation, the resulting rotational forces and the electromagnetic interaction are such that the annular dimension of the air gap 128 is maintained and contact between the rotor 120 and stator 122 is prevented. However, as indicated, both the rotor windings 130 and the stator windings 136 may axially traverse the axial length of the rotor 120 and stator 122 several times necessitating repeated turns of the windings back upon themselves. These end turns 144 occur at the axial ends of the rotor 120 and stator 122. When the rotor and stator windings 130, 136 are made of conductive wiring, the sharp end turns 144 may cause adjacent conductors to contact each other or conductors from adjacent groups to contact each other, resulting in an electrical short referred to a winding inter-turn fault. Winding inter-turn faults and similar electrical winding faults may occur when the insulation about the conductor, typically varnish, breaks or fractures.

The inter-turn fault may result in unbalanced magnetic interaction between the rotor 120 and the stator 122 resulting, for example, in stronger or weaker magnetic attraction in a radial direction between the components along certain segments or arcs of the 360° interface between the rotor and stator. The unbalanced or radially asymmetric magnetic interaction between the rotor 120 and the stator 122 and may physically attempt to radially pull the rotor and stator together across the air gap 128. Accordingly, rather than the rotor 120 and stator 122 being in a true concentric arrangement, the rotor may begin eccentrically revolving with respect to the stator. The eccentric relative rotation results in oscillating mechanical vibrations that can be imparted through the generator housing 110.

The eccentric rotation of the rotor 120 and the resulting oscillating mechanical vibrations can be oriented in various different directions or orientations. For example, the unbalanced magnetic interaction between the rotor 120 and the stator 122 can result in a radially directed vibration 150 with respect to the rotation axis 108 (i.e. normal to the rotation axis), as indicated by the arrow. Continuous eccentric rotation of the rotor 120 also will result in tangential vibrations 152 that continuously moves around the rotation axis 108. Moreover, because the end turns 144 are located at the axially ends of the rotor 120 and/or stator 122, the inter-turn faults can cause the rotor shaft 124 to become unbalanced along its axial length. The unbalanced or skewed rotation of rotor shaft 124 can result in an axial vibration 154 directed axially along the rotation axis 108. The mechanical vibrations in each of the radial, tangential, and/or axial directions can be transmitted via the rotor shaft 124 through the bearings 126 to the generator housing 110 causing the generator housing to vibrate in various different directions.

Referring to FIG. 1, to measure the mechanical vibrations resulting from the winding inter-turn faults, one or more vibration sensors 160 can be included on the generator housing 110 at different locations. For example, a vibration sensor 160 can be located at each axial end of the electrical generator 104 to sense the mechanical vibration caused by eccentric rotation at that location. Moreover, a vibration sensor 160 can be located at each axial end on the top of the generator housing 110 and to either lateral side of the generator housing. These locations for vibration sensors 160 enable measurements of the resulting mechanical vibrations to be made in various directions. For example, vibration measurements may be made in the axial direction of the generator, i.e. axial vibration measurements 162, made with reference to the rotation axis 108. Vibration measurements can be made in a radial direction perpendicular to the rotation axis 108, such as vertical vibration measurements 164. Vibration measurements can also be obtained side-to-side of the electrical generator 104 or traversely with respect to the rotation axis 108 i.e., traverse vibration measurements 166. The axial vibration measurements 162, vertical vibration measurements 164, and traverse vibration measurements 166 can correspond to a Cartesian (x-y-z) coordinate system. Additional measurements can be made in other directions or orientations of the electrical generator 104 and the rotation axis 108.

The vibration sensors 160 can utilize any suitable vibration sensing technology. For example, in an embodiment, the vibration sensors 160 can be accelerometers or acceleration sensors. When an accelerometer is made to accelerate in a particular direction, a measureable acceleration force is imparted to the accelerometer. The accelerometer can be constructed with a sensing element capable of measuring the imparted forces or stresses. For example, the accelerometer can include a piezoelectric element, which can be a crystal that generates and emits an electrical signal or impulse when a force or stress is applied to it. In another embodiment, the accelerometer can utilize capacitive sensing technology in which two conductive elements separated by a flexible or pliable dielectric are capacitively coupled through a common electromagnetic field. When a force or stress is applied to the accelerometer, the conductive elements can move towards or away from each other altering the capacitive effective in a measureable manner. Other technologies for the vibration sensors 160 can include micro electrical-mechanical systems (MEMS) in which a micro-machined cantilevered lever can be displaced by an applied acceleration force and the displacement measured.

In an embodiment, the vibration sensors 160 can measure acceleration, and thus mechanical vibrations, in one or more axes and are sometimes characterized as single axis or multi-axis sensors. The different axes can be defined with respect to a Cartesian coordinate system. In an embodiment, the vibration sensors 160 can include a plurality of output leads which each output lead corresponding to forces measured in a specific direction. In other words, each output lead is associated with a coordinate and when active indicates that acceleration forces arising from mechanical vibrations are being applied to the vibration sensor 160 along that particular direction. Hence, the different output leads enable the vibration sensor 160 to discern mechanical vibrations occurring to the electrical generator in the various directions, i.e. axial vibration measurements 162, vertical vibration measurements 164, and traverse vibration measurements 166.

Figure 3:
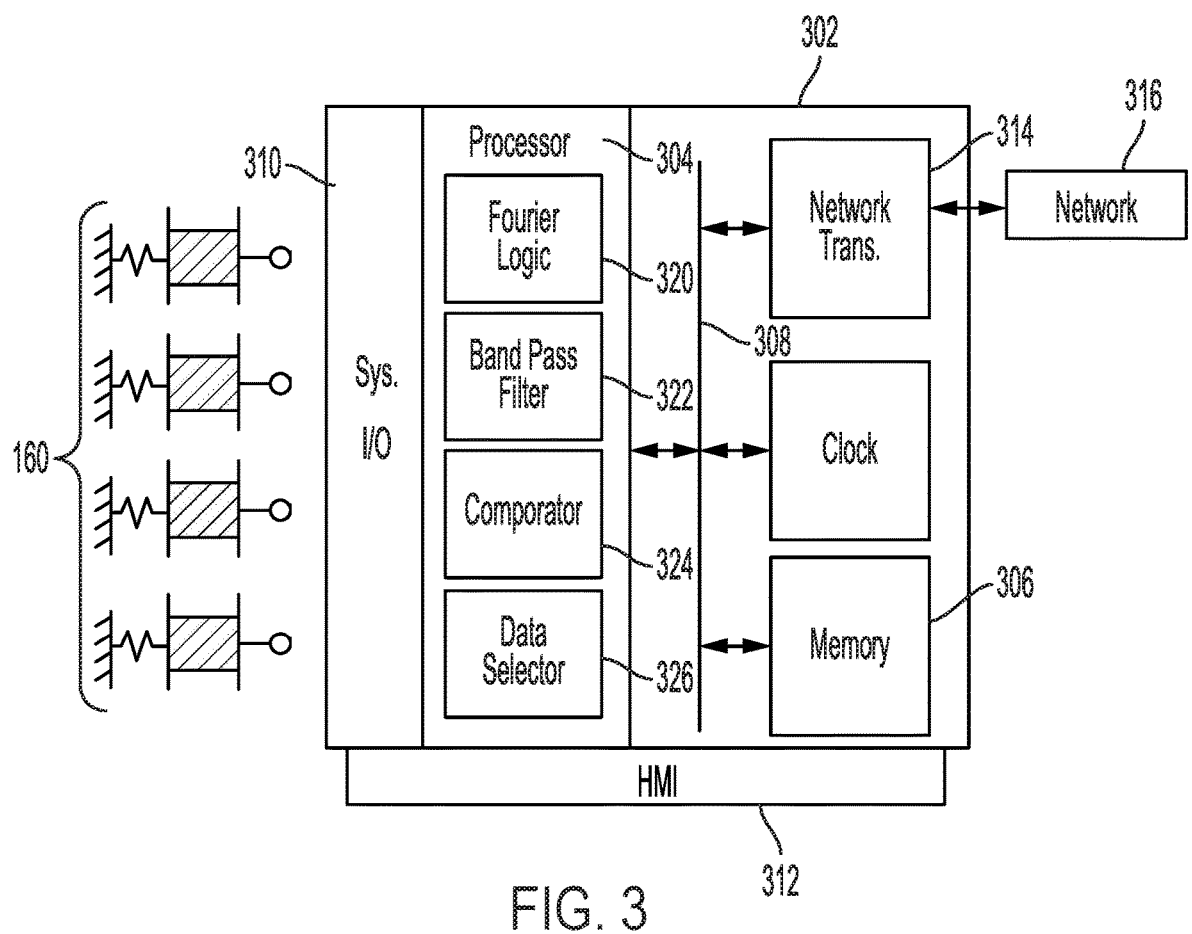
FIG. 3 is a schematic block diagram of a fault detection system for detecting stator and/or rotor winding inter-turn faults in an electrical generator by measuring mechanical vibrations on the generator housing.

Referring to FIG. 3, the vibration sensors 160 can be operatively associated with a detection system 300 for detecting winding inter-turn faults that may occur with the electrical generator 104. The detection system 300 can be embodied as a computer operable program or application utilizing instructions and data in programmable software code. To implement or execute the detection system 300, the detection system can include or be associated with an electronic controller 302, sometimes referred to as an electronic control module (ECM) or electronic control unit (ECU). The electronic controller 302 can be configured to analyze and identify a stator and/or rotor winding fault, and is thus referred to herein as a fault analyzer. To process electronic data and execute instruction, the fault analyzer 302 can include one or more microprocessors 304 or similar circuitry like an application specific integrated circuit (ASIC) or a field programmable gate array. As explained below, the microprocessors 304 can include or be programmed to conduct specific logical functions, and can be configured with or associated with appropriate circuitry for performing such operation. The microprocessor 304 can be programmable to read, write, access, and or execute instructions to perform functions, steps, routines, access and update data tables, and the like that are associated with the detection system 300. To store the software instructions embodying the detection system, the fault analyzer 302 can include a system memory 306 or similar data storage. In various aspects, the system memory 306 can be readable, writable, or combinations thereof. The system memory 306 can communicate with the microprocessor 304 via a bus 308.

To communicate with the vibration sensors 160, the fault analyzer 302 can include a system input/output (I/O) interface 310 which can use any suitable electronic interface protocol or standard such as Ethernet or the like. The system I/O interface 310 can include one or more physical ports, jacks, or buses like USB that can connect with signaling and communication conductors such as conductive wires or fiber optic cables. The system I/O interface 310 can send and receive electronic data signals with the vibration sensors 160 in the form of computer processable bits and bytes. To interface with the human operators, the fault analyzer 302 can include or be associated with a human-machine interface (HMI) 312 that can include visual displays, touch screens, keypads, and other input/output technologies. Furthermore, the fault analyzer 302 associated with the detection system 300 can include a network transceiver 314 to communicate with other computer processing systems via network 316. The network 316 can be implemented in any suitable form such as the internet, WLAN, LAN, etc. Referring to FIG. 1, the fault analyzer 302 and associated components can be part of the control panel 114 located on the genset 100. Although the illustrated fault analyzer 302 is depicted as a single unit, in other embodiments, the fault analyzer and its functionality may be distributed among various devices and locations.

Figure 4:
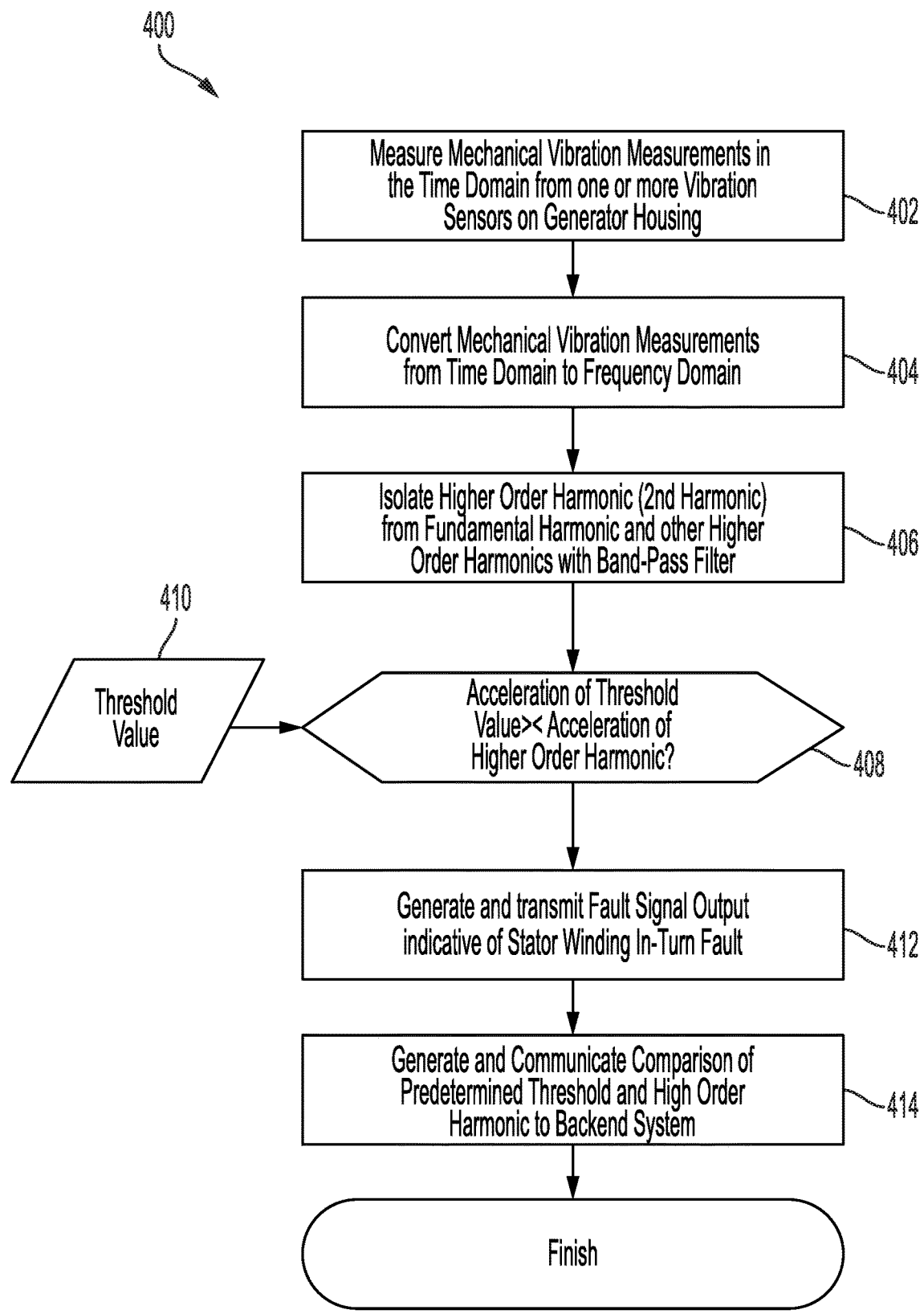
FIG. 4 is a flow diagram of a possible process for detecting stator winding inter-turn faults that may be implemented by the fault detection system of FIG. 3

Referring to FIG. 4, there is illustrated a stator inter-turn fault detection process 400 for detecting stator winding inter-turn faults or shorts that can occur with the electrical generator. The stator inter-turn fault detection process 400 can be represented as a series of steps and operations written in computer executable software code that can be implemented or run by the fault analyzer 302 of the detection system 300. In an initial measurement step 402, the detection system 300 make mechanical vibration measurements using one or more of the vibration sensors 160 disposed on the generator housing 110 of the electrical generator 104. The mechanical vibration measurements represent physical, periodic displacements of the generator housing 110 and the vibration sensors 160 measure the mechanical vibrations in terms of acceleration (e.g. m/s$^2$) or changes in acceleration over time.

Figure 5:
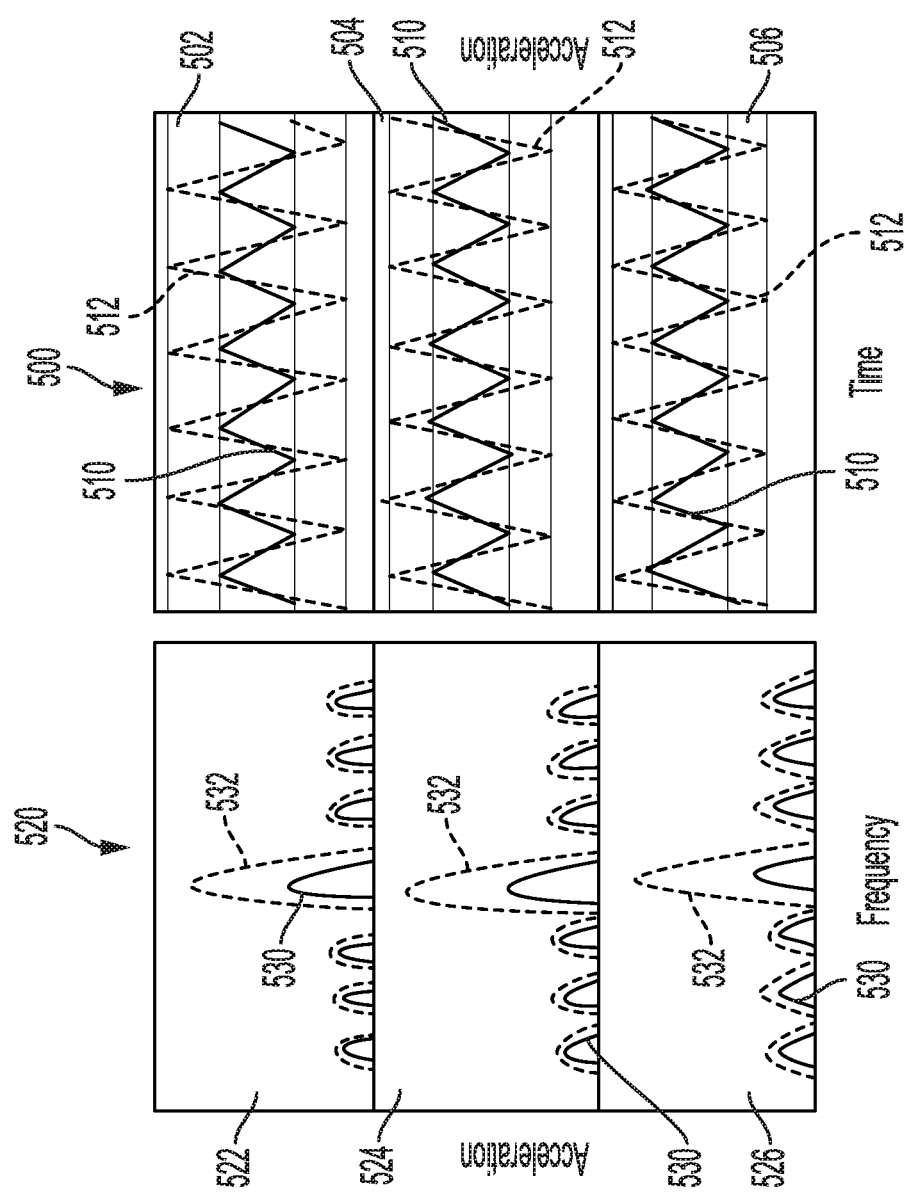
FIG. 5 is an example of a graph of the mechanical vibration measurements made with respect to time and the correspond frequency spectrum of the mechanical vibration measurements of an electrical generator as operating normally and with a stator winding inter-turn fault.

For example, referring to FIG. 5, the vibration sensors 160 can obtain time-dependent data 500 representing vibration measurements in terms of acceleration (Y-axis) with respect to or as a function of time (X-axis). The time data 500 can be depicted by three individual time charts, 502, 504, and 506, that can represent mechanical vibration measurements made by vibration sensors 160 at three separate locations on the generator housing 110 and/or can be associated with the three coordinates including the axial vibration measurements 162, vertical vibration measurements 164, and traverse vibration measurements 166. However, in other embodiments, fewer or more vibration sensors and/or directions may be used.

FIG. 5 depicts mechanical vibration measurements of a normally operating electrical generator 104, as indicated by the normal vibration curve 510, during which the rotor 120 concentrically and symmetrically rotates in the stator 122. FIG. 5 also depicts mechanical vibration measurements of an electrical generator 104 operating with a stator winding inter-turn fault as indicated by the fault vibration curve 512. Asymmetric or eccentric rotation of the rotor 120 caused by the stator winding inter-turn fault increases the displacement and the acceleration of the displacement that is measured by the vibration sensors 160, and thus the amplitude of the fault vibration curve 512 is larger than the amplitude or magnitude of the normal vibration curve 510. Because the vibrations associated with the electrical generator 104 will occur continuously as the generator operates, the normal vibration curve 510 and the fault vibration curve 512 can be represented as periodic sine waves or a periodic sinusoid curve in time.

To convert the mechanical vibration measurements for processing and analysis by the detection system 300, the stator inter-turn fault detection process 400 can include a conversion step 404 as illustrated in FIG. 4. In an embodiment, the conversion step 404 can utilize a Fourier transformation calculation or other time-frequency conversion techniques to convert the mechanical vibration measurements from time data 500, indicated by the individual time charts 502, 504, 506 in FIG. 5, to frequency data 520 as indicated by frequency charts. In the frequency domain, the mechanical vibration measurements are represented according to their constituent frequencies and related variables, i.e. amplitude and/or phase. The frequency data 520 can depict the components of the mechanical vibration measurements according to their different frequencies (X-axis) measured in hertz and depicts their respective acceleration (Y-axis) as the amplitude or magnitude of the resulting curve. There can be three corresponding frequency charts 522, 524, 526 that can each include a normal vibration curve 530 associated with normal operation of the electrical generator 104 and a fault vibration curve 532 associated with a stator winding inter-turn fault. To convert the time data 500 to frequency data 520, the fault analyzer 302 can be configured to be programmed or include circuitry to perform Fourier logic 320, for example, by conducting a fast Fourier transformation calculation. Thereafter, the detection system 300 can analyze the resulting frequency spectra in the frequency data 520 for indicia of a stator winding inter-turn fault.

To analyze the frequency data 520, the stator inter-turn fault detection process 400 can conduct harmonic analysis to isolate various harmonics in the frequency data. For example, the different frequencies depicted in the frequency data 520 can be associated with the different harmonics of the mechanical vibration measurements. The normal vibration curve 530 and the fault vibration curve 532 of the frequency data 520 can include a fundamental harmonic and one or more higher order harmonics, which may be multiples of the fundamental harmonic. For example, the fundamental harmonic of the mechanical vibration measurements may occur at a specific frequency in hertz, the second harmonic will occur at twice that frequency, the third harmonic will occur at three times that frequency, and the fourth harmonic will occur at four times that frequency.

To conduct harmonic analysis, the stator inter-turn fault detection process 400 can include an isolation step 406 in which a higher order harmonic in the frequency spectrum depicting the frequency data 520 is separated from the fundamental harmonic and other higher order harmonics. For example, the isolated harmonic can occur at a specific frequency, indicated by rectangle 534, which is a multiple of the fundamental frequency. Because the mechanical vibration measurements associated with the stator winding inter-turn fault are larger than the mechanical vibration measurements associated with a normal operation, the acceleration (i.e. amplitude or magnitude) of the fault vibration curve 532 at the isolated higher order harmonic 534 can be larger than the acceleration (amplitude or magnitude) of the normal vibration curve 530. In an embodiment, the isolated higher order harmonic 534 identified by the isolation step 406 can be the second order harmonic of the mechanical vibration measurements made by the vibration sensors 160. To separate and isolate the second order harmonic, the isolation step 406 can use a band-pass filter that passes certain signals having certain frequencies while blocking others. Referring to FIG. 3, the band-pass filter 322 can be embodied as an electronic circuit operatively associated with the microprocessor 304 of the detection system 300.

Once the higher order harmonic has been isolated, the stator inter-turn fault detection process 400 can conduct a comparison step 408 in which the acceleration of the mechanical vibration measurements (i.e. amplitude or magnitude of the frequency charts) associated with the isolated higher order harmonic are compared with a predetermined threshold value 410 indicative of a stator winding inter-turn fault. The threshold value 410 can be predetermined empirically by operating the genset 100 or similar gensets normally or having varying degrees of stator winding inter-turn faults and the resulting mechanical vibration of the electrical generator measured. For example, the threshold value 410 can equate with the normal operation plot 530 in FIG. 5 and the comparison with the isolated higher order harmonic 534 can be made at that frequency. Referring to FIG. 3, the microprocessor 304 can include a comparator 324 in the form of programming logic or circuitry to determine which of the two inputs (i.e. isolated higher order harmonic or threshold value) has a greater amplitude or magnitude.

If the acceleration of mechanical vibration measurements obtained by the vibration sensors 160 exceeds the threshold value at the isolated higher order harmonic 534, the stator inter-turn fault detection process 400 can conduct a fault signaling step 412. For example, the detection system 300 may generate a fault signal indicative of the stator winding inter-turn fault that can be output through the HMI 312 as a visual or audible alarm. In an embodiment, the fault analyzer 302 can also conduct a transmission step 414 to transmit the fault signal to the network 316 via the network transceiver 314.

Figure 6:
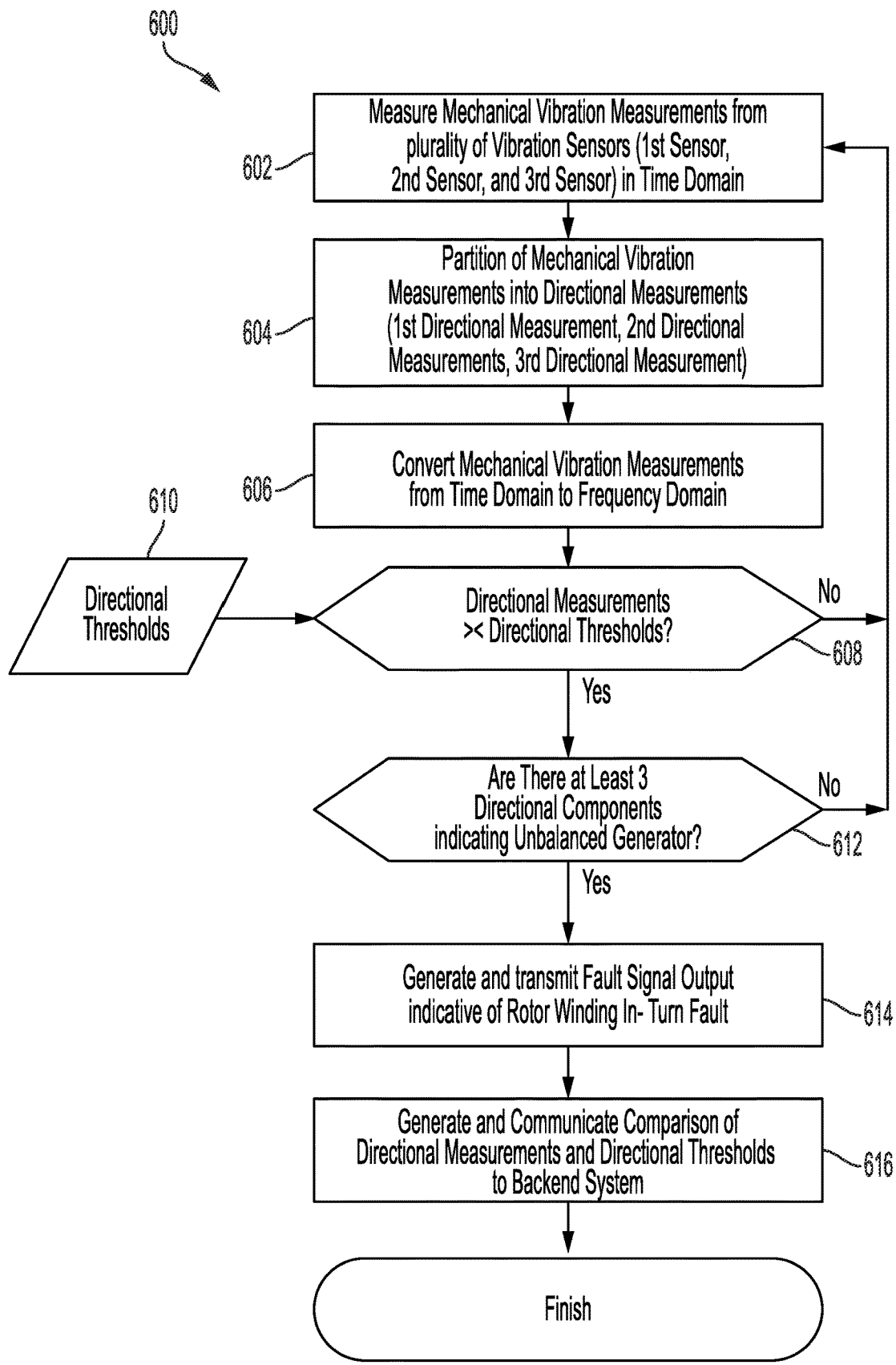
FIG. 6 is a flow diagram of a possible process for detecting rotor winding inter-turn faults that may be implement by the fault detection system of FIG. 3.

The detection system 300 can also be configured to detect winding inter-turn faults with the rotor 120. Referring to FIG. 6, there is illustrated a rotor inter-turn fault detection process 600 that can be implemented or run by the fault analyzer 302 of the detection system 300. In an initial measurement step 602, the detection system 300 makes mechanical vibration measurements using the vibration sensors 160 disposed on the generator housing 110 of the electrical generator 104. The mechanical vibration measurements represent physical periodic displacements of the generator housing 110 and the vibration sensors 160 measure the mechanical vibrations in terms of acceleration (e.g. m/s') or changes in acceleration over time. In the rotor inter-turn fault detection process 600, the mechanical vibration measurements can be made from a plurality of vibration sensors 160 and can be resolved or partitioned into a plurality of directions.

To partition the mechanical vibration measurements into the different directions, the rotor inter-turn fault detection process 600 can include a partitioning step 604. For example, in an embodiment, the vibration sensors 160 may be of the multi-axis configuration and can output electrical signals corresponding to the different directions of the mechanical vibration measurements over different identifiable data signaling channels. The data signaling channel can be multiplexed or remain distinct. In another embodiment, the vibration sensors 160 may be single axis and output an electrical signal uniquely corresponding to a particular direction of the mechanical vibration measurements. Referring to FIG. 3, to separate the incoming data signals received at the system I/O interface 310 from the plurality of vibration sensors into distinct directions or locations of the mechanical vibration measurements made with respect to the electrical generator 104, the fault analyzer 302 can include a de-multiplexer or similar data selector logic 326 or circuitry. For example, the mechanical vibration measurements can include at least a first directional measurement, a second directional measurement, and a third directional measurement.

Figure 7:
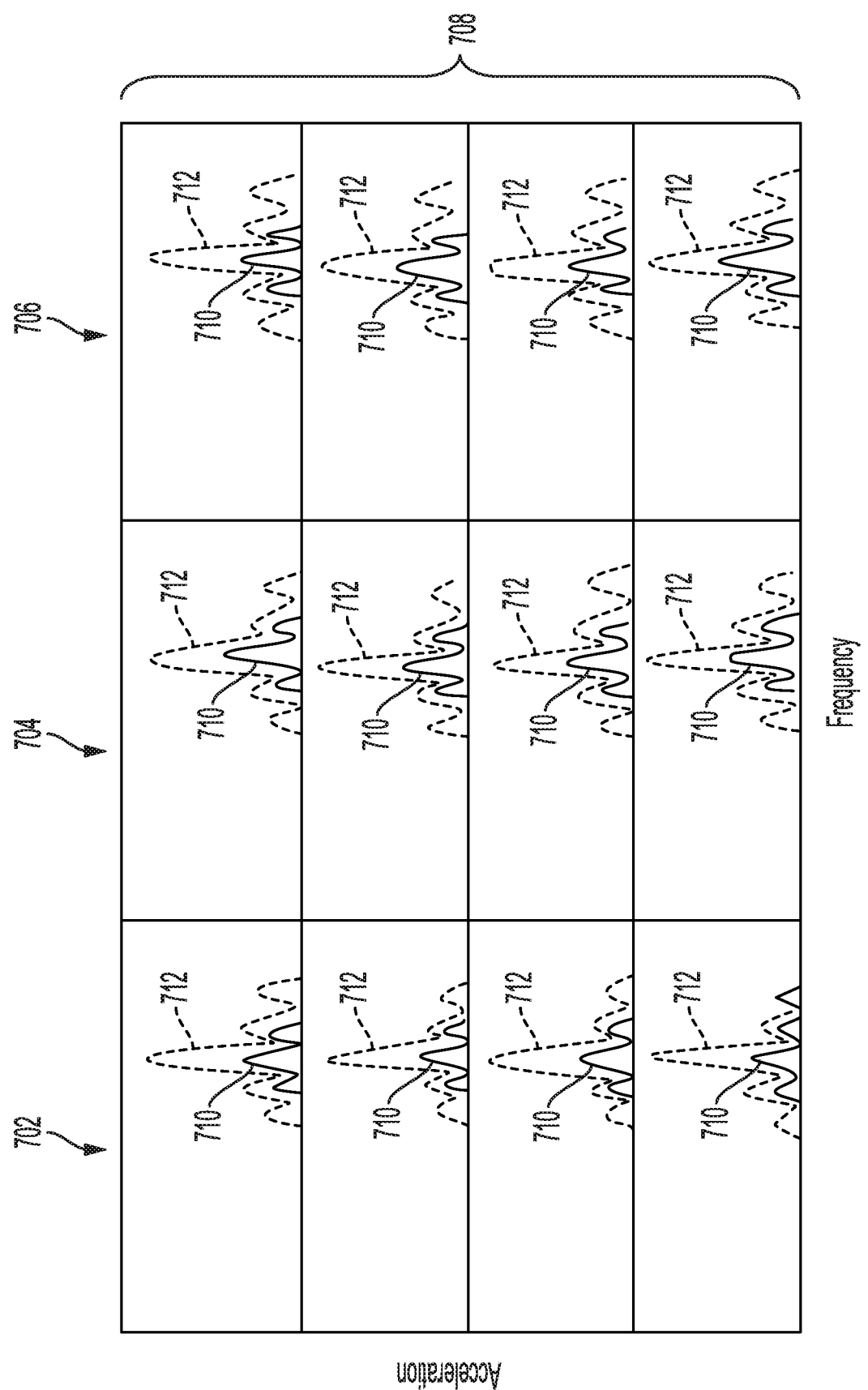
FIG. 7 is an example of a graph of the mechanical vibration measurements depicted as a frequency spectrum as operating normally and with a rotor winding inter-turn fault.

For example, referring to FIG. 7, there is illustrated a chart 700 depicting a first sub-chart 702 of the first directional measurement, a second sub-chart 704 of the second directional measurement, and a third sub-chart 706 of the third directional measurement. In an embodiment, the first, second, and third sub-charts 702, 704, and 704 can correspond to axial vibration measurements 162, vertical vibration measurements 164, and traverse vibration measurements 166 associated with the electrical generator 104. In addition, the chart 700 represents measurements from a plurality of different vibration sensors, indicated by bracket 708, at different locations on the generator housing 110.

FIG. 7 depicts data corresponding to mechanical vibration measurements of a normally operating electrical generator 104 as indicated by the normal vibration curves 710. FIG. 7 also depicts data corresponding to mechanical vibration measurements of an electrical generator 104 operating with a rotor winding inter-turn fault as indicated by the fault vibration curve 712. Because the asymmetric or eccentric rotation of the rotor 120 caused by the rotor inter-turn fault increases the displacement measured by the vibration sensors 160, the acceleration (i.e. amplitude) of the fault vibration curve 712 is larger than the acceleration (i.e. amplitude) of the normal vibration curve 710. In an embodiment, the data depicted in the chart 700 and sub-charts 702, 704, 706 can be frequency-dependent data in the frequency domain with the acceleration (Y-axis) measured with respect to frequency measured in hertz (X-axis). The frequency domain data represented in chart 700 can be initially obtained as time-dependent data and converted to the frequency domain for ease of analysis. The rotor inter-turn fault detection process 600 can include a conversion step 606 to convert from the time domain to the frequency domain, for example, by a fast Fourier transformation. Conversion between time data and frequency data can be accomplished by the Fourier logic 320 of the fault analyzer 302.

To analyze the mechanical vibration measurements, the rotor inter-turn fault detection process 600 can proceed to a comparison step 608 in which the magnitude of the mechanical vibration measurements associated with the higher order harmonic are compared with threshold values 610 indicative of a rotor winding inter-turn fault. The threshold values 610 can include a first threshold value to compare with the first directional measurement, a second threshold value to compare with the second directional measurement, and a third threshold value to compare with the third directional measurement. The directional measurements and the threshold values can be compared on the basis of acceleration (i.e. amplitude or magnitude) correlating with the mechanical vibration measurements. The first, second, and third threshold values may be the same or different from each other. The threshold values 610 can be predetermined empirically as described above. If the directional measurements do not exceed the threshold values 610, the rotor inter-turn fault detection process 600 can return to the measurement step 602.

If the mechanical vibration measurements are exceeding the threshold values 610, the rotor inter-turn fault detection process 600 can assess whether the electrical generator is vibrating or fluctuating in multiple directions, for example, at least the three Cartesian directions. Measureable vibrations in a particular number of directions may be indicative of an unbalanced electrical generator 104. A query step 612 can make this determination based on the number or analysis of the sub-charts 702, 704, 706 associated with the different directions. If mechanical vibration measurements do not occur in a particular number of directions, such as a minimum number of directions, the rotor inter-turn fault detection process 600 can return to the measurement step 602.

If the mechanical vibration measurements obtained by the vibration sensor 160 exceed the threshold values 610, the rotor inter-turn fault process 600 can conduct another fault signaling step 614. For example, the detection system 300 can generate a fault signal indicative of a rotor winding inter-turn fault output through the HMI 312. The rotor inter-turn fault process 600 can also include a transmission step 616 to transmit the fault signal to the network 316 via the network transceiver 314.

INDUSTRIAL APPLICABILITY

The detection system 300 for detecting winding inter-turn faults with stator and/or rotor windings can be provided as an embedded system incorporated with gensets 100 as they are assembled. The threshold values for comparison with the mechanical vibration measurements can be obtained during assembly of the genset 100. In an embodiment, the detection system 300 can also be provided as an aftermarket kit for fitting to gensets 100 operating in the field. Referring to FIG. 3, the plurality of vibration sensors 160 and the fault analyzer 302 can be provided together as a kit or package. The vibration sensors 160 can be mounted to the exterior of the generator housing 110 at select locations without accessing the interior of the electrical generator 104 or interfering with the arrangement and clearances of the moving internal components of the generator. The fault analyzer 302 can be accommodated into the control panel 114 or, in an embodiment, may be uploaded to existing computing devices in the control panel.

In an embodiment, the information obtained by detection system 300 can be transmitted to a remote backend system 318 for further analysis and storage. In particular, the mechanical vibration measurements and the associated analysis conducted by the detection system 300 can be transmitted to the backend system 318 over the network 316 via the transceiver 314. The backend system 318 may provide updated threshold value for comparison with the mechanical vibration measurements, may track a progress log of the mechanical vibration measurements, and may arrange for corrective action to be taken to remedy identified inter-turn fault and similar winding faults occurring with the stator and/or rotor windings.

It will be appreciated that the foregoing description provides examples of the disclosed system and technique. However, it is contemplated that other implementations of the disclosure may differ in detail from the foregoing examples. All references to the disclosure or examples thereof are intended to reference the particular example being discussed at that point and are not intended to imply any limitation as to the scope of the disclosure more generally. All language of distinction and disparagement with respect to certain features is intended to indicate a lack of preference for those features, but not to exclude such from the scope of the disclosure entirely unless otherwise indicated.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context.

Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

We claim:
1. A detection system for detecting winding inter-turn faults in a stator of a poly-phase synchronous electrical generator comprising:
    a rotor rotatably disposed on a rotation axis;
    a stator including a plurality of stator windings fixedly disposed around the rotor;
    one or more vibration sensors disposed on a generator housing of the electrical generator that accommodates the stator and the rotor, the vibration sensors configured to measure mechanical vibration measurements in a time domain and to output an electrical signal indicative of the mechanical vibration measurements; and a fault analyzer in communication with the vibration sensors to receive the electrical signal, the fault analyzer configured to convert the mechanical vibration measurements from the time domain to a frequency domain including a plurality of harmonics; to isolate a higher order harmonic from a fundamental harmonic and further higher order harmonics; compare the higher order harmonic with a threshold value; and generate and output a fault signal indicative of a stator winding inter-turn fault if the higher order harmonic exceeds the threshold value.

2. The detection system of claim 1, wherein the fault analyzer includes logic to convert mechanical vibration measurements from the time domain to the frequency domain by fast Fourier transformation.

3. The detection system of claim 2, wherein the fault analyzer includes a band pass filter to isolate the higher order harmonic.

4. The detection system of claim 3, wherein the higher order harmonic is a second harmonic of the mechanical vibration measurements.

5. The detection system of claim 4, wherein the one or more vibration sensors are accelerometers.

6. The detection system of claim 5, wherein the higher order harmonic and the threshold value are compared based on acceleration at the second harmonic.

7. The detection system of claim 6, wherein the threshold value is predetermined empirically.

8. A kit for detecting winding inter-turn faults in a poly-phase synchronous electrical generator comprising:
   one or more vibrations sensors for mounting to a generator housing of the electrical generator accommodating a stator and a rotor, the vibration sensors configured to measure mechanical vibration measurements in a time domain and to output an electrical signal indicative of the mechanical vibration measurements;
   a fault analyzer configured to receive the electrical signal; configured with logic to convert the mechanical vibration measurements from the time domain to a frequency spectrum including a plurality of harmonics in a frequency domain; configured to isolate a higher order harmonic from the fundamental harmonic and further higher order harmonics; configured to compare the higher order harmonic in the frequency domain with a threshold value; and configured to generate a fault signal output if the higher order harmonic exceeds the threshold value; and
   a network transceiver configured to communicate the fault signal output to a backend system.

9. The kit of claim 8, wherein the fault analyzer is configured to isolate a higher order harmonic from a fundamental harmonic and plurality of other higher order harmonics.

10. The kit of claim 9, wherein the network transceiver is configured to communicate a comparison of the frequency spectrum with the threshold value to the backend system.

11. The kit of claim 8, wherein the fault analyzer the fault analyzer includes a band pass filter to isolate the higher order harmonic.

12. The kit of claim 11, wherein the higher order harmonic is a second harmonic of the mechanical vibration measurements.

13. The kit of claim 12, wherein the one or more vibration sensors are accelerometers.

14. The kit of claim 13, wherein the higher order harmonic and the threshold value are compared based on acceleration at the second harmonic.

15. The kit of claim 14, wherein the threshold value is predetermined empirically.

16. A detection system for detecting winding inter-turn faults in a stator of a poly-phase synchronous electrical generator comprising:
   a rotor rotatably disposed on a rotation axis;
   a stator including a plurality of stator windings fixedly disposed around the rotor;
   one or more accelerometers disposed on a generator housing of the electrical generator that accommodates the stator and the rotor, the accelerometers configured to measure mechanical vibration measurements in a time domain and to output an electrical signal indicative of the mechanical vibration measurements; and
   a fault analyzer in communication with the vibration sensors to receive the electrical signal, the fault analyzer configured to convert the mechanical vibration measurements from the time domain to a frequency domain including a plurality of harmonics; to isolate a second harmonic from a fundamental harmonic and further higher order harmonics via a band pass filter; compare the second harmonic with a threshold value on the basis of acceleration; and generate and output a fault signal indicative of a stator winding inter-turn fault if the second harmonic exceeds the threshold value.

17. The detection system of claim 16, wherein the threshold value is predetermined empirically.

* * * * *